United States Patent [19]

West et al.

[11] Patent Number: 5,528,602
[45] Date of Patent: Jun. 18, 1996

[54] METHOD FOR DETERMINING COMPUTER SUBSYSTEM PROPERTY

[75] Inventors: Roderick M. P. West, Colchester, Vt.; Christopher J. Melhuish, Marchwood, United Kingdom

[73] Assignee: International Business Machines Corporation, Armonk, N.Y.

[21] Appl. No.: 400,699

[22] Filed: Mar. 9, 1995

Related U.S. Application Data

[63] Continuation of Ser. No. 999,472, Dec. 30, 1992, abandoned.

[51] Int. Cl.⁶ .................. G11C 29/00; H03M 13/00
[52] U.S. Cl. .................. 371/22.4; 371/25.1; 371/37.1; 371/21.1
[58] Field of Search .................. 371/22.4, 25.1, 371/37.1, 53, 21.1, 21.2, 21.3, 21.6

[56] References Cited

U.S. PATENT DOCUMENTS

| | | | |
|---|---|---|---|
| 4,380,070 | 4/1983 | Steiner | 371/25.1 X |
| 4,395,764 | 7/1983 | Matsue | 365/78 |
| 4,598,401 | 7/1986 | Whelan | 371/22.4 |
| 4,622,652 | 11/1986 | Zumchak et al. | 371/22.4 X |
| 4,683,555 | 7/1987 | Pinkham | 365/215 |
| 4,726,025 | 2/1988 | Splett et al. | 371/25.1 |
| 4,747,081 | 5/1988 | Heilveil et al. | 365/219 |
| 4,768,195 | 8/1988 | Stoner et al. | 371/25.1 |
| 4,884,069 | 11/1989 | Farand | 340/799 |
| 4,890,261 | 12/1989 | Hidake et al. | 365/73 |
| 4,893,072 | 1/1990 | Matsumoto | 371/25.1 X |
| 4,947,106 | 8/1990 | Chism | 371/22.4 X |
| 5,018,146 | 5/1991 | Sexton | 371/37.1 |
| 5,053,698 | 10/1991 | Ueda | 371/25.1 X |
| 5,065,369 | 11/1991 | Toda | 365/230.05 |

*Primary Examiner*—Ellis B. Ramirez
*Assistant Examiner*—Eric W. Stamber
*Attorney, Agent, or Firm*—Wayne F. Reinke; Heslin & Rothenberg

[57] ABSTRACT

The presence or absence of a property in a computer subsystem is determined using a multiple input shift register (MISR). A subsystem device operates on predetermined test data to produce output data. The MISR operates on the output data to produce a final test value dependent on the output data. The property has a known final MISR value associated with the device under test and the test data. The MISR final test value is read and compared to the known final value for the property. If the two values are the same, the property exists in the system. In a second embodiment, a property from among a set of known possible properties or variations of a property is determined. In a specific application of the second embodiment, the length of a serial access memory (SAM) portion of a video random access memory (VRAM) is determined.

18 Claims, 3 Drawing Sheets

METHOD FOR DETERMINING COMPUTER SUBSYSTEM PROPERTY

This application is a continuation, of application Ser. No. 07/999,472, filed Dec. 30, 1992, now abandoned.

BACKGROUND OF THE INVENTION

Technical Field

The present invention relates generally to computer subsystems. More particularly, the present invention relates to a method for determining computer subsystem properties in a subsystem including a multiple input shift register.

Background Art

Multiple input shift registers (MISRs), also known as linear feedback shift registers and signature analysis registers in the graphics art, have been known and used in many computer arts for quite some time as a diagnostic tool. In the past, their use has been limited to either testing to see if a block of data has been successfully transferred, or testing to see if a device in the system is generally malfunctioning.

The MISR is initially cleared or set to a particular value, such as all 1's. Blocks of data are checked by sequentially combining all the incoming data with that present in the MISR to arrive at a final value or "CHECKSUM". The CHECKSUM is then compared to a value representing a CHECKSUM of the added data as intended to be sent. A discrepancy indicates the data was not properly transferred. In general, many items of data are applied sequentially to the MISR before the CHECKSUM is read or tested. This method has been found to be extremely accurate. A device can be tested for proper functioning by a MISR by sending data, with a known CHECKSUM that would be produced if the device were operating properly, through the device and having the MISR generate a CHECKSUM value for the device output. The output CHECKSUM is then compared to the known CHECKSUM, a discrepancy indicating a device malfunction. The CHECKSUM produced by the MISR is dependent upon the data applied. Any difference in data, caused by a device malfunction, will generally produce a different CHECKSUM.

In video memory subsystems with a video random access memory (VRAM), a MISR is conventionally used to check the operation of various devices within the subsystem. VRAMs are a type of memory commonly used in video memory subsystems. A VRAM is essentially a conventional dynamic random access memory (DRAM) with the addition of a second port, called a serial or a SAM port, where data may be accessed serially. A VRAM consists of a random access memory (RAM) portion and a serial access memory (SAM) portion with transfer gates which allow data to pass from the RAM to the SAM. The SAM array today may have a memory capacity of one row or a half row of the RAM array. A full row or half row, respectively, of memory data may be passed from the RAM to the SAM in a single data transfer access. The RAM port and the SAM port may be operated asynchronously and independently except when the data transfer between the RAM and the SAM is taking place. A SAM is also known by the designation "VRAM shift register," but will only be referred to herein as SAM.

A video memory subsystem is generally a part of a graphics subsystem. Such a subsystem includes a video memory, a graphics controller, and a serializer palette digital to analog converter device (SPDAC). The graphics controller controls the update of video memory and the output of data from the video memory to the SPDAC and then to the display. In such systems it is vital that the controller be able to determine the length of the SAM portion of the VRAM. The controller must know how often, and when to reload the SAM from the RAM array to maintain a continuous and seamless flow of data out of the SAM serial port to the SPDAC and then to a display monitor. The data must be seamless as the display requires a continuous flow of data (i.e., no breaks). A SPDAC is also known as a random access memory digital to analog converter (RAMDAC).

As an example of the effects of the controller not knowing the SAM length consider the following scenario. Assume a VRAM with a half-row SAM is put into a subsystem configured for a full row SAM. After n serial clock cycles, where n is the SAM length, the SAM data repeats since the subsystem is configured for a full row SAM. The result is an image on the video display comprising two identical half images of the intended image, rather than the full image intended. In order for the full image to be displayed as intended, the subsystem must be configured for a half-row SAM.

At present, there exists no conventional means for the controller to determine the SAM length. One possible way for the controller to determine SAM length is through the use of memory ID pins. These pins would identify the VRAM and software would determine the type of SAM contained therein (e.g., full or half). However, use of such pins would require standardization in the industry, and wastes pins on the memory module and controller device which could be used for other purposes. Pins are a scarce resource in the graphics art—there are never enough.

Thus, a need exists for a method which allows for determining properties in a computer subsystem without adding additional hardware. In particular, there exists a specific need for a method for determining SAM length in a display memory subsystem.

DISCLOSURE OF THE INVENTION

Briefly, the present invention satisfies the need to determine properties of a computer subsystem which includes a multiple input shift register (MISR) by utilizing the MISR to produce a CHECKSUM which is then compared to a known CHECKSUM to determine if a property exists in a system.

A computer subsystem envisioned in the present invention includes a device to be tested and a MISR, which is utilized for diagnostic testing. In the context of the invention, "device" is meant to include one or more physical devices. The MISR is capable of performing a test that operates on data to produce a CHECKSUM value that is dependent on the data. A CHECKSUM value is a final value in the MISR after the test is run.

In a first embodiment, whether a particular property exists in a subsystem is determined. A "property" in the context of the present invention is not meant to include the malfunctioning of a device. The method of the first embodiment begins with loading the device to be tested with predetermined test data. The device then operates on the test data according to the property under test. The MISR is activated and the device output data is transferred from the device to the MISR where the MISR operates on the output data to produce a test CHECKSUM value. The test CHECKSUM value is then read and compared to a known CHECKSUM value associated with the device being examined and the predetermined test data. If the two CHECKSUM values match, then the property is present in the subsystem. If the two CHECKSUM values do not match, then the device has not operated on the test data according to the property under test and therefore that property is not present in the subsystem.

In a second embodiment, a property is determined from among a plurality of possible properties. Each possible property has a known CHECKSUM associated therewith for predetermined test data. The property is determined by reading and then comparing the test CHECKSUM to each known CHECKSUM until a match is found. The known CHECKSUM that matches the test CHECKSUM indicates which property is present in the subsystem.

In a specific application of the second embodiment of the invention, the SAM length of a VRAM in a video memory subsystem is determined utilizing the method of the second embodiment. The CHECKSUM value produced is compared to known CHECKSUM values for currently available SAM lengths (e.g., half row and full row) to determine which length of SAM is present in the subsystem.

These, and other objects, features and advantages of this invention will become apparent from the following detailed description of the presently preferred embodiments of the invention taken in conjunction with the accompanying drawings.

BEST MODE FOR CARRYING OUT THE INVENTION

In a first embodiment of the invention, the presence or absence of a particular property in a computer subsystem is determined. The subsystem must include a MISR or its equivalent. Although a "device" associated with the property being tested for will be referred to herein, it will be understood that the property may be associated with one or more physical devices which may encompass the entire subsystem itself. The property has a known CHECKSUM value associated with the property and the test data used to test that property.

The device associated with the property, if the property is present, operates on predetermined test data to produce output data to be used by the MISR. It will be understood that the output data could be the same as the test data if, for example, a memory device is the device associated with the property, or the output data could be the same data in a different form, or the output data could be different from the test data, for example, if the device performs mathematical or logical operations thereon in accordance with the property under consideration.

The MISR must be capable of performing a test that produces a CHECKSUM value. Data is fed into the MISR, where it is sequentially combined with whatever data is already present in the MISR to arrive at a final or CHECKSUM value. The CHECKSUM produced will depend on the data fed to the MISR. In the present invention, the data fed into the MISR is the output of the property-associated device after it has operated on the predetermined test data. A particular example of a subsystem, device and MISR will be described subsequently.

The method of the first embodiment begins with the device associated with the property under test operating on the predetermined test data and producing output data. The MISR is cleared (i.e., set to a fixed value, such as all 0's or all 1's) and enabled before the output data is fed to the MISR, which produces a test CHECKSUM therefor. The test CHECKSUM is read and compared with the known property CHECKSUM to detect a match between the CHECKSUMs. The comparing could be done, for example, by a processor. If a match is found, the property is present in the subsystem. If no match is found, then the property is not present in the subsystem.

In a second embodiment, a property from among several possible properties or from among variations of a single property in a computer subsystem is determined. The predetermined test data is chosen such that device output data will produce a MISR CHECKSUM indicative of, assuming the device is working properly, which property or variation is present. The steps of the first embodiment are followed, except that the test CHECKSUM is compared with each known CHECKSUM to determine if there is a match. The property or variation associated with the known CHECKSUM that matches the test CHECKSUM is the property present or variation of a property present in the subsystem.

Figure 1:
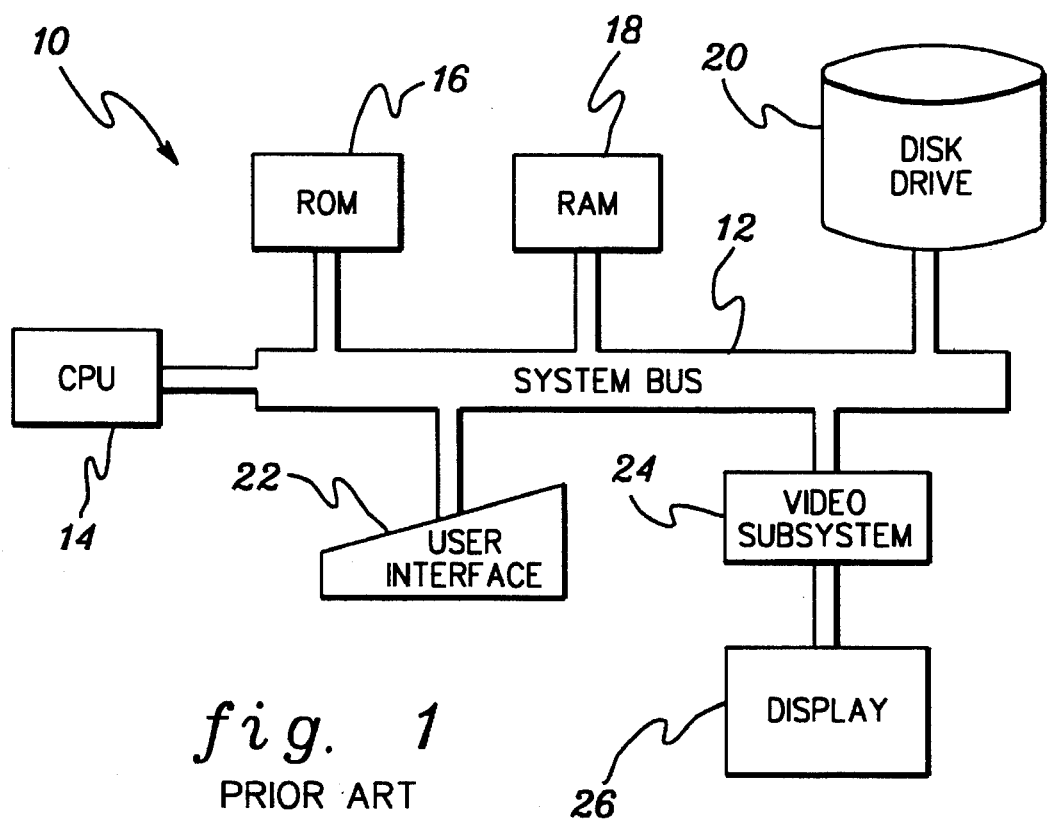
FIG. 1 is a block diagram of a workstation.

Computer graphics systems exist in many forms. An exemplary computer graphics work station 10 is depicted in FIG. 1. Connected by system bus 12 are: CPU 14; read-only-memory 16; random access memory 18; disk drive 20; a user interface 22, which could be a keyboard and/or a mouse; and video subsystem 24. A video subsystem is also known as a display adapter. A display device 26 is connected to the video subsystem 24. Such a graphics system is known in the art and details regarding its operation are therefore not necessary.

Figure 2:
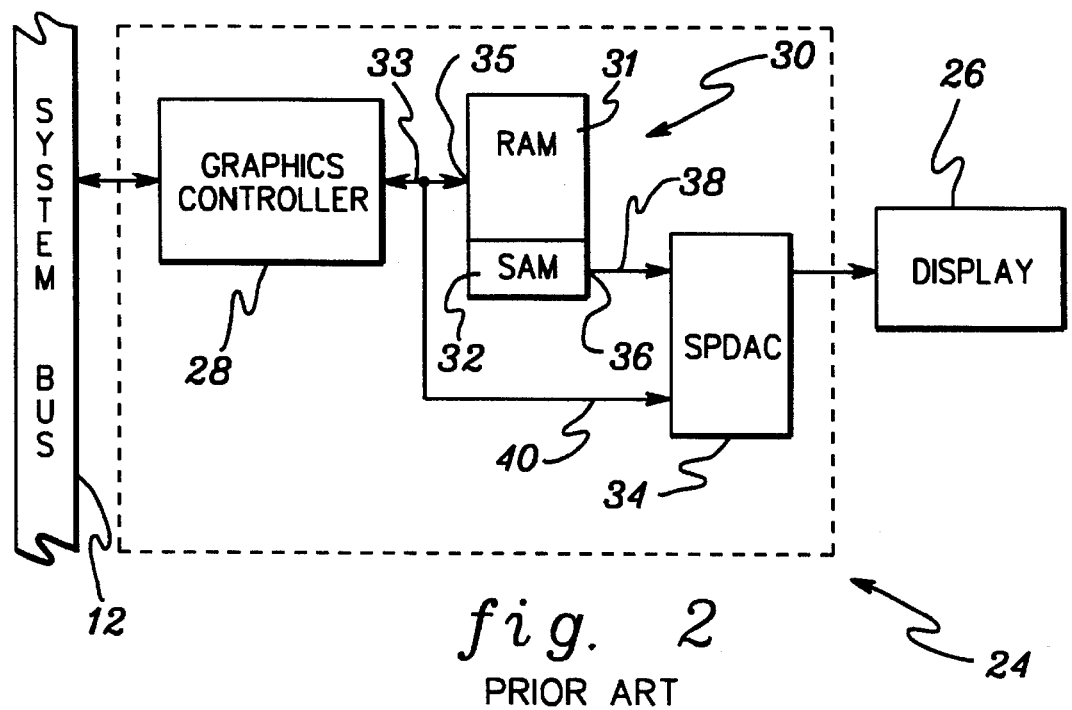
FIG. 2 is a more detailed block diagram of the video subsystem of FIG. 1.

Video subsystem 24 is depicted in expanded block diagram form in FIG. 2 and comprises a graphics controller 28 a dual port video random access memory (VRAM) 30 including a RAM portion 31 and a serial access memory (SAM) portion 32, and a serializer palette digital to analog converter (SPDAC) 34. Graphics controller 28 controls data transfers from RAM portion 31 of VRAM 30 to SAM portion 32. This control is extended via line 33 and VRAM update port 35. Serial data is sent from RAM 31 to SAM 32 and then out SAM port 36 to SPDAC 34 over line 38. Line 40 represents a programming interface to the SPDAC 34, which is also controlled by controller 28. The basic operation of such a video subsystem is well known in the art.

Figure 3:
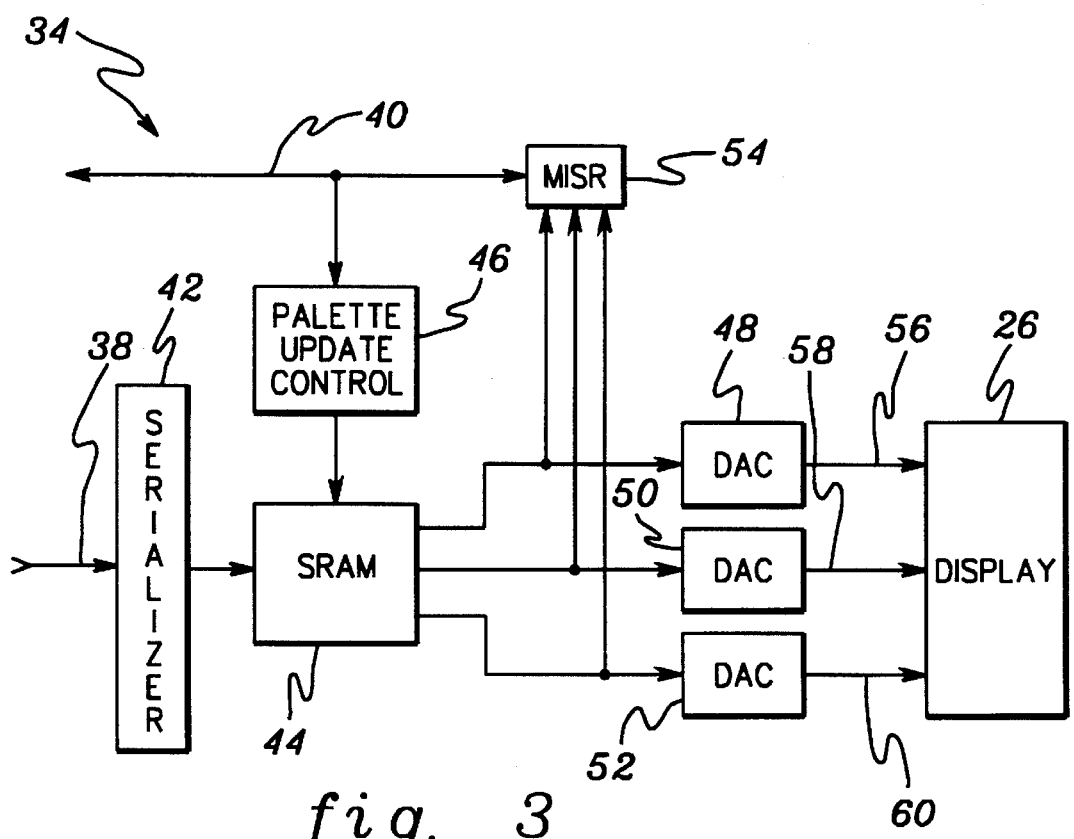
FIG. 3 is a more detailed block diagram of the SPDAC of FIG. 2.

FIG. 3 is an expanded block diagram of SPDAC 34. SPDAC 34 includes serializer 42, palette static RAM (SRAM) 44, palette update control 46, digital to analog converters (DACs) 48, 50 and 52, and multiple input shift register (MISR) 54. Controller 28 controls MISR 54 over programming interface 40. Palette update control 46 and palette SRAM 44 will be referred to collectively as a palette. The serializer 42 takes data from the serial port of the VRAM (SAM port 36) and converts it to a stream of information one pixel wide. Assuming display 26 is color, the serial stream of pixel data is then used to address a palette SRAM to convert the data from color indices to digital color values to be displayed for each pixel. The DACs convert the digital color values to analog levels and send them off the SPDAC chip on three video lines 56, 58 and 60 for connection to the display 26. The video lines carry analog signals representing the colors red, green and blue, one line for each color. If the display is monochrome, then generally only a single DAC and video line are used; otherwise, the operation remains the same.

Figure 4:
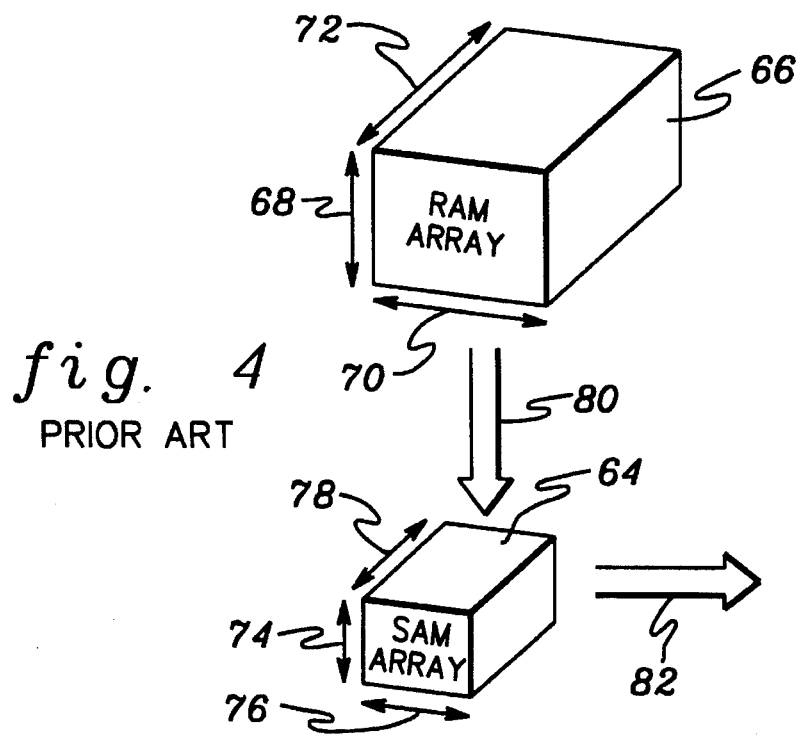
FIG. 4 is a block diagram of a 4 megabit VRAM (256K× 16) with a half row SAM array.

FIG. 4 is a block diagram visualization of a 4 megabit VRAM 256K×16) which could be used in the video subsystem of FIG. 2. The RAM array 66 is 16 bits wide (72) and has 512 rows (68) and 512 columns (70). The SAM array 64 is 16 bits wide (78) and consists of 1 row (74) of 256 columns (76). A SAM with 256 columns is referred to as a half-row SAM. A SAM with 512 columns is known as a full-row SAM. A transfer path 80 selects one half of a RAM row at a time to send to the SAM, since the SAM row length is half that of the RAM row length. When the first half has been accessed via a serial port, the second half of the RAM row is then transferred or sent to the SAM. A full row SAM would have 512 columns and 1 full RAM row at a time would be sent to the SAM from the RAM. Both types of VRAM, whether full-row or half-row SAM, have 16 bit wide data and the same organization of rows and columns, and thus look the same to the controller 28 at the RAM port 35. The controller 28 does not see the serial port (SAM port 36) or the serial data output 82.

In this particular exemplary application, the general method of the second embodiment is used to determine SAM length of VRAM 30 in video subsystem 24. The particular length of a given SAM is a variation of a single property—length. In the context of a SAM, length means the portion of a RAM data row that the SAM can accept in a single data transfer. To date, known SAM lengths are referred to as full and half, 512 and 256 columns, respectively. Different SAM lengths are expected in the future and are encompassed by the present invention.

Figure 5:
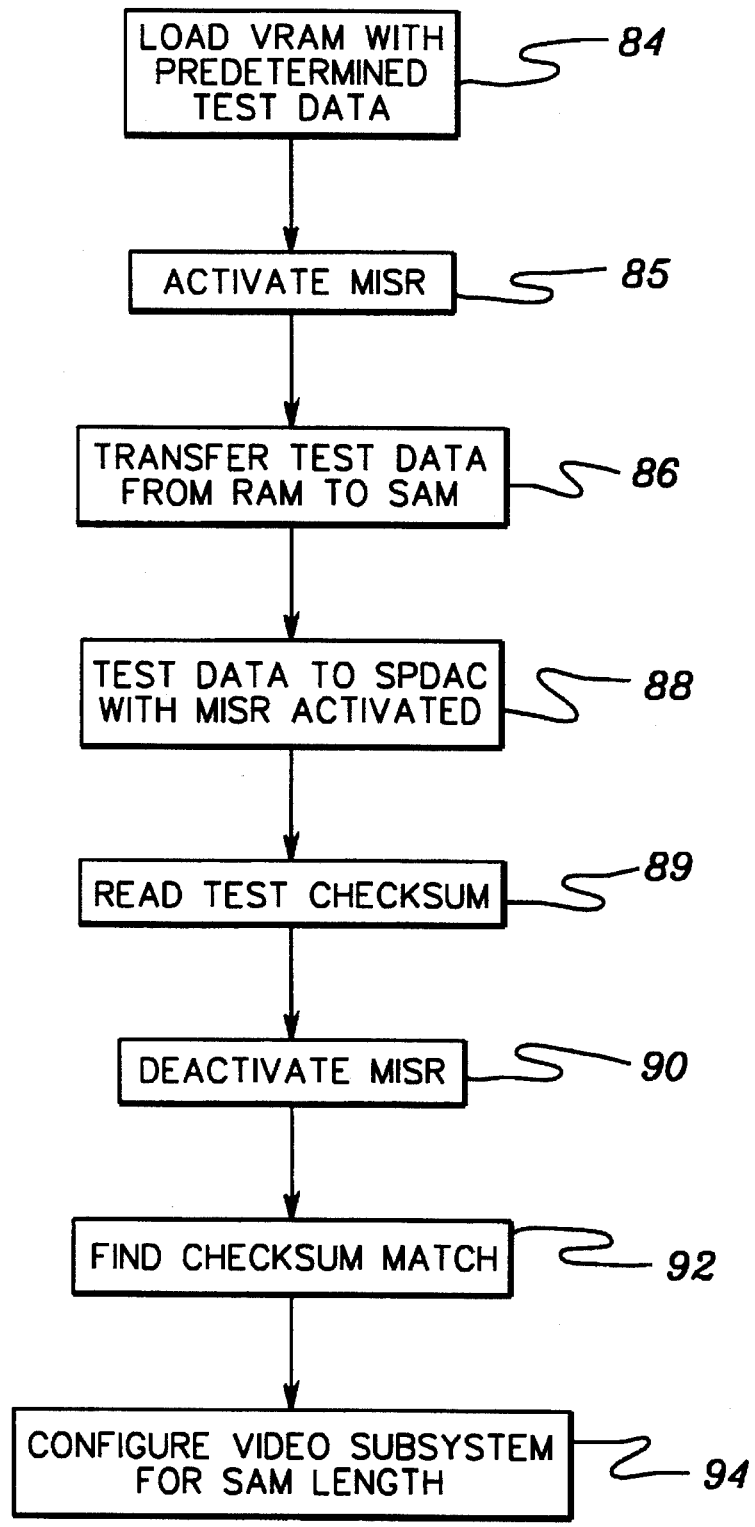
FIG. 5 is a flow chart for determining SAM length according to the second embodiment of the invention.

FIG. 5 is a flow chart for determining SAM length from among a set of possible SAM lengths according to the second embodiment of the present invention. The RAM 31 portion of the VRAM 30 is loaded with predetermined test data through RAM port 35. (Step 84, "Load VRAM with Predetermined Test Data.") The test data may be, for example, data defining an image or data derived through simulation. The test data must have a length at least as long as the shortest possible SAM length. Controller 28 activates MISR 54 by setting it to a fixed initial value and enabling it over programming interface 40. (Step 85, "Activate MISR.") Controller 28 then transfers the test data from RAM 31 to SAM 32. (Step 86, "Transfer Test Data from RAM to SAM.") Controller 28 transfers the test data from SAM port 36 to the SPDAC 34 over line 38. The test data is serialized by serializer 42, sent through SRAM 44 and into activated MISR 54. MISR 54 operates on the test data and produces a test CHECKSUM. (Step 88, "Test Data to SPDAC with MISR Activated.") The test CHECKSUM is then read (Step 89, "Read Test CHECKSUM") over programming interface 40, and the MISR may then be de-activated (Step 90, "De-activate MISR"). The test CHECKSUM is then compared to each possible known CHECKSUM until a match is found. The matching known CHECKSUM indicates the SAM length. (Step 92, "Find CHECKSUM Match.") The video subsystem 24 may then be configured for the determined SAM length. (Step 94, "Configure Video Subsystem for SAM Length.")

The video memory subsystem will now be operated correctly for the SAM type present and the double half imaging problem previously described will no longer be present. It will be understood that although a single VRAM has been described, multiple VRAMs typically exist in a given video memory subsystem and there may even be a mixture of VRAM types having different SAM lengths. The method of the present invention is applicable to all such systems.

In the context of video subsystems, there is another example of a property to which the present invention is applicable. Some VRAMs have the ability to stop at a programmed point, known as a stop point, in the data sequence transferred from the RAM to the SAM and resume transferring at another programmed point in the sequence, known as a start point. A VRAM could be tested with data including such start and stop points and the sequence operated on by the MISR. In this way, it can be determined whether a VRAM present in the subsystem supports such start/stop points.

While presently preferred embodiments of the invention have been described and depicted herein, alternative embodiments may be effected by those skilled in the art to accomplish the same objectives. Accordingly, it is intended by the appended claims to cover all such alternative embodiments as fall within the true spirit and scope of the invention.

We claim:

1. A method for determining a length from among a plurality of possible lengths of a serial access memory (SAM) portion of a video random access memory (VRAM), the VRAM including a random access memory (RAM) portion and being part of a display memory subsystem which also includes a serializer palette digital to analog converter (SPDAC) with an associated multiple input shift register (MISR), said MISR being utilized for diagnostic testing including a test that operates on data to produce a CHECKSUM dependent on said data, each possible SAM length having a particular known CHECKSUM associated therewith, said method comprising:

loading said RAM with predetermined test data, said predetermined test data having a length at least as long as a shortest possible SAM length;

activating said MISR;

transferring said predetermined test data from said RAM to said SAM;

transferring said predetermined test data from said SAM through said SPDAC with said MISR activated, wherein said MISR operates on said predetermined test data to produce a test CHECKSUM;

reading said test CHECKSUM; and comparing said test CHECKSUM to each said known CHECKSUM to determine if said test CHECKSUM matches one of said known CHECKSUMs, whereby a matching known CHECKSUM indicates said SAM length.

2. The method of claim 1 wherein said predetermined test data comprises data defining an image.

3. The method of claim 1 wherein said predetermined test data comprises data derived through simulation.

4. The method of claim 1 wherein said MISR is activated by:

setting said MISR to a fixed initial value; and enabling said MISR.

5. The method of claim 1 further comprising a step of de-activating said MISR after said test CHECKSUM is produced.

6. The method of claim 1 further including a step of configuring said subsystem to operate based on said SAM length indicated by said matching known CHECKSUM.

7. A method for determining whether a property is present in a computer subsystem including a known device to be tested for said property and a multiple input shift register (MISR), said known device to be operated with predetermined test data, said MISR being utilized for diagnostic testing, said diagnostic testing including a test that operates on output data from said known device to produce a final value (CHECKSUM) dependent on said output data, wherein said property is one of a serial access memory length and a start/stop point, and wherein said property has a known CHECKSUM associated with said known device and said test data, said predetermined method comprising steps of:

operating said known device with said predetermined test data to produce output data;

activating said MISR;

transferring said output data from said known device to said MISR, said MISR operating on said output data to produce a test CHECKSUM;

reading said test CHECKSUM; and comparing said test CHECKSUM to said known CHECKSUM, whereby equal CHECKSUMs indicates said property is present in said subsystem and nonequal CHECKSUMs indicates said property is not present in said subsystem.

8. The method of claim 7 further comprising a step of de-activating said MISR after said test CHECKSUM is produced.

9. The method of claim 7 wherein activating said MISR comprises:

setting said MISR to a fixed initial value; and enabling said MISR.

10. The method of claim 7 wherein said step of comparing is carried out by a processor.

11. The method of claim 7 wherein said known device comprises one or more known physical devices in said subsystem.

12. The method of claim 7 further including a step of configuring said subsystem to operate based on a result of said step of comparing.

13. A method for determining a property from among a plurality of possible properties or a plurality of variations of a single property in a computer subsystem, said subsystem including a known device to be operated with predetermined test data and a MISR utilized for diagnostic testing, said testing including a test that operates on output data from said known device to produce a CHECKSUM dependent on said output data, wherein said plurality of possible properties consist of a serial access memory length and a start/stop point, wherein said single property is one of a serial access memory length and a start/stop point, and wherein each possible property or variation has a particular known CHECKSUM associated with said known device and said predetermined test data, said method comprising steps of:

operating said known device with said predetermined test data to produce output data;

activating said MISR;

transferring said output data from said known device to said MISR, said MISR operating on said output data to produce a test CHECKSUM;

reading said test CHECKSUM; and comparing said test CHECKSUM to each said known CHECKSUM, to determine if said test CHECKSUM matches one of said known CHECKSUMs, whereby a matching known CHECKSUM indicates said property of said known device.

14. The method of claim 13 further comprising a step of de-activating said MISR after said test CHECKSUM is produced.

15. The method of claim 13 wherein activating said MISR comprises:

setting said MISR to a fixed initial value; and enabling said MISR.

16. The method of claim 13 wherein said step of comparing is carried out by a processor.

17. The method of claim 13 wherein said known device comprises one or more known physical devices in said subsystem.

18. The method of claim 13 further including a step of configuring said subsystem to operate based on a property indicated by said matching known CHECKSUM.

\* \* \* \* \*